United States Patent [19]
Yamaguchi

[11] Patent Number: 6,114,900
[45] Date of Patent: Sep. 5, 2000

[54] MANUFACTURING INDEPENDENT CONSTANT CURRENT POWER SOURCE

[75] Inventor: Hiroshi Yamaguchi, Tokyo, Japan

[73] Assignee: NEC Corporation, Tokyo, Japan

[21] Appl. No.: 09/110,398

[22] Filed: Jul. 6, 1998

[30] Foreign Application Priority Data

Jul. 4, 1997 [JP] Japan ..................................... 9-195070

[51] Int. Cl.⁷ .............................. G05F 3/02; H03K 17/14
[52] U.S. Cl. ........................... 327/541; 327/543; 323/315
[58] Field of Search .................................... 327/541, 542, 327/543, 108; 323/315, 312, 313

[56] References Cited

U.S. PATENT DOCUMENTS

| | | | |
|---|---|---|---|
| 4,446,444 | 5/1984 | Patterson, III | 330/264 |
| 4,791,326 | 12/1988 | Vajdic et al. | 327/391 |
| 5,300,837 | 4/1994 | Fischer | 327/281 |
| 5,329,177 | 7/1994 | Nagai | 326/121 |
| 5,598,122 | 1/1997 | McClure | 327/538 |
| 5,793,247 | 8/1998 | McClure | 327/538 |

FOREIGN PATENT DOCUMENTS

| | | | |
|---|---|---|---|
| 59-74714 | 4/1984 | Japan | H03F 3/345 |
| 6-334445 | 12/1994 | Japan | H03F 3/193 |

OTHER PUBLICATIONS

Japanese Office Action (Feb. 1, 2000) with English translation of portion regarding teachings of prior art.

*Primary Examiner*—Timothy P. Callahan
*Assistant Examiner*—Terry L. Englund
*Attorney, Agent, or Firm*—Sughrue, Mion, Zinn, Macpeak & Seas, PLLC

[57] ABSTRACT

A semiconductor integrated circuit having a power source circuit which assures a constant operating current without regard to manufacture fluctuations is provided. Saturated range of MOS transistors are used as a reference current source, and the current is applied to a load using current mirror circuits so that the current through the load is equal to the current in of the reference current source. A constant operating current is provided without regard to manufacture fluctuations.

4 Claims, 5 Drawing Sheets

101:FET₁
102:SIGNAL INPUT TERMINAL
103:CAPACITOR
104:FET₂
105:RESISTOR R₁
106:RESISTOR R₂
107:RESISTOR R₃
108:RESISTOR R₄
109:BIAS APPLYING TERMINAL
110:GND

121:TRANSMISSION LINE 1
122:TRANSMISSION LINE 2
123:INDUCTOR
124:CAPACITOR
125:CAPACITOR
126:DRAIN BIAS TERMINAL
127:SIGNAL OUTPUT TERMINAL

MANUFACTURING INDEPENDENT CONSTANT CURRENT POWER SOURCE

FIELD OF THE INVENTION

This invention relates to a semiconductor integrated circuit and, more particularly, to a semiconductor integrated circuit including a power source circuit having a constant operating current irrespective of manufacture tolerances.

BACKGROUND

As a conventional semiconductor integrated circuit having a gate bias circuit which renders the operating current constant irrespective of manufacture tolerances, the configuration shown in FIG. 5 is disclosed in e.g., JP Patent Kokai JP-A-6-334445. Referring to FIG. 5, a second field-effect transistor FET 2, manufactured by the same process as the process for fabricating a first field-effect transistor FET 1 used for amplification, having the same structure as the first FET and having a smaller total gate width, is arranged in a gate bias circuit in the same chip with the first FET. The gate bias circuit is configured so that a voltage value determined by a drain current Id22 of the second FET 2 and a resistance value connected to a source terminal of the second FET 2 will be applied to the gate bias terminal of the first FET 1.

The operation is hereinafter explained.

If a transistor is manufactured so that there flows a current Id2 of a large magnitude, more current flows in resistor R2 to produce a significant voltage drop Vg1. This voltage drop is negatively fed back to the first FET 1 to manage control so that the current Id1 will be constant.

SUMMARY OF THE DISCLOSURE

The gate bias circuit shown in FIG. 5 has the following drawbacks.

(1) The first drawback is that manufacture tolerances cannot be decreased because an absolute value of the resistance is used.

The reason is that, when the resistor is manufactured by a semiconductor manufacturing process, it cannot be manufactured with a precisely controlled absolute resistance value.

(2) The second drawback is that the current value cannot be rendered constant between plural chips.

The reason is that the chips are necessarily subjected to manufacture tolerances.

In view of the above-mentioned problems of the prior art, it is an object of the present invention to provide a semiconductor integrated circuit having a power source circuit the operating current of which is perpetually constant irrespective of manufacture tolerances.

Further objects of the present invention will become apparent in the entire disclosure.

For accomplishing the object, one aspect of the present invention provides a novel semiconductor integrated circuit. The integrated circuit comprises an nMOS transistor having its source and gate connected to a low magnitude side power source terminal and to a first control terminal, respectively : a first current mirror circuit mirror-reflecting (mirrorwise folding) the current flowing in the nMOS transistor; a pMOS transistor having its source and gate connected to a high magnitude side power source terminal and to a second control terminal, respectively; and a second current mirror circuit mirror-reflecting the current flowing in the pMOS transistor, wherein output terminals of the first and second current mirror circuits respectively provide a higher and a lower potential to serve as the power source of a load circuit.

According to a second aspect of the present invention there is provided a further semiconductor integrated circuit. The integrated circuit comprises:

a first nMOS transistor having its source and gate connected to a low magnitude side power source terminal and to a first control terminal, respectively;

a first pMOS transistor having its source connected to a high magnitude side power source terminal and having its gate and drain connected to the drain of the first nMOS transistor;

a second pMOS transistor having its source connected to a high magnitude side power source terminal and having its gate connected to the drain of the first nMOS transistor;

a third pMOS transistor having its source connected to the high magnitude side power source terminal and having its gate connected to a second control terminal;

a second nMOS transistor having its source connected to the low magnitude side power source terminal and having its gate and drain connected to the drain of the third pMOS transistor; and a third nMOS transistor having it source connected to the low magnitude side power source terminal and having its gate connected to the drain of the third pMOS transistor;

wherein the second pMOS transistor has its drain connected to provide a high-side potential for a power source of a load circuit, and the third nMOS transistor has its drain connected to provide a low-side potential of the power source to the same terminal of the load circuit.

BRIEF DESCRIPTION OF THE DRAWINGS

FIG. 2 illustrates the operation of the first embodiment of the present invention, wherein FIG. 2A shows the basic circuit structure and FIG. 2B shows I–V characteristics of the basic circuit of FIG. 2A.

PREFERRED EMBODIMENTS

Figure 1:
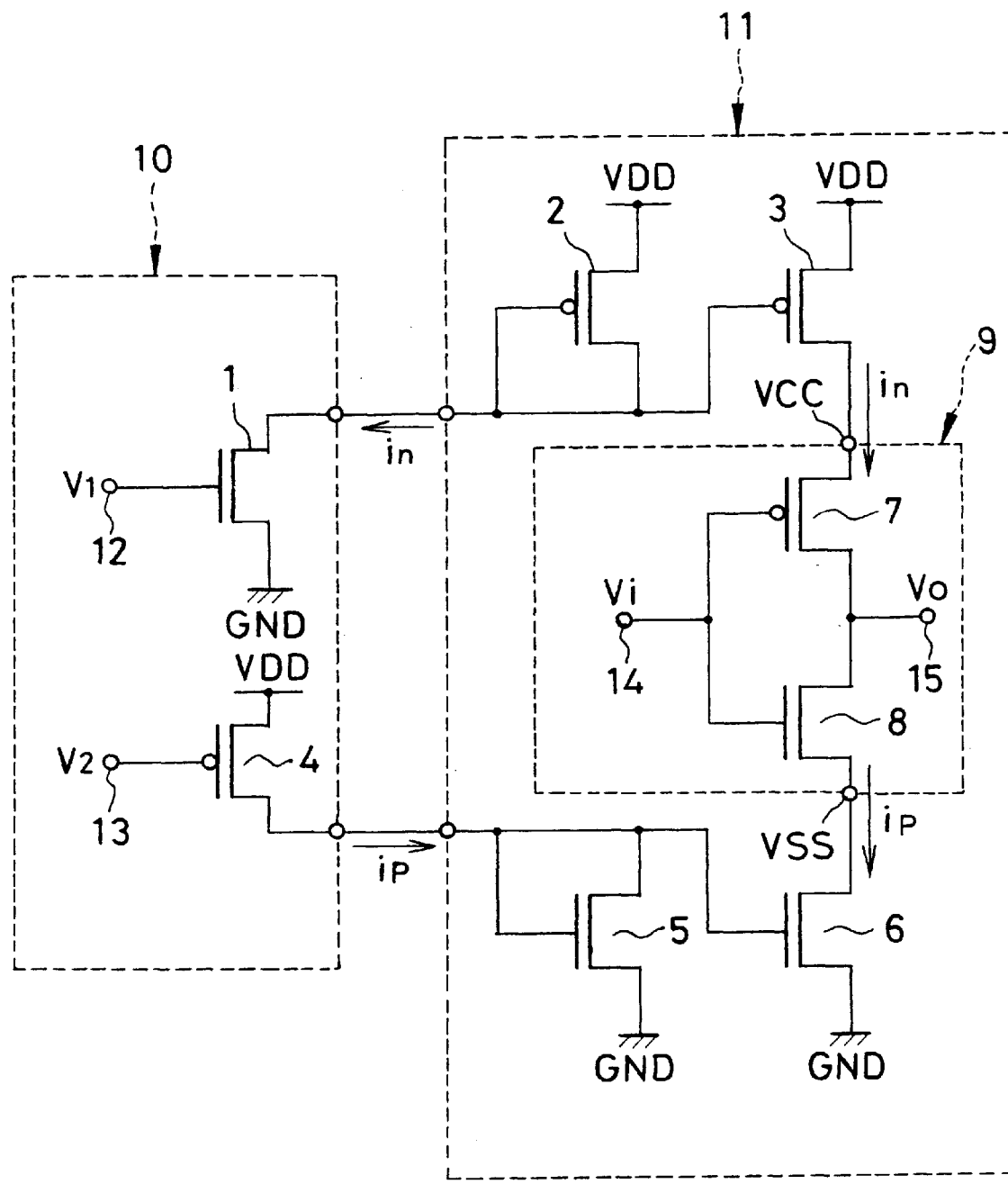
FIG. 1 shows a circuit structure of a first embodiment of the present invention.

In the following, preferred embodiments of the present invention are explained. In its preferred form, a semiconductor integrated circuit of the present invention has a reference current source (1, 4 of FIG. 1) and current mirror circuits (2, 3 and 5, 6 of FIG. 1) each of which provides a current having the same current value as that of the reference current source (ip or in of FIG. 1). By exploiting the saturated range of the MOS transistor, the current source can supply a perpetually constant current, even if characteristics of the load MOS transistor suffer from fluctuations. The same current value as that of the current source is supplied by the current mirror circuit to the load.

More specifically, the semiconductor integrated circuit of the present invention has, in its preferred form, a first nMOS transistor (1 of FIG. 1) having its source and gate connected to a low magnitude side power source terminal and to a first control terminal (12 of FIG. 1), respectively, a first pMOS transistor (2 of FIG. 1) having its source connected to a high magnitude side power source terminal and having its gate and drain connected to the drain of the first nMOS transistor. There is a second pMOS transistor (3 of FIG. 1) having its source connected to a high magnitude side power source and having its gate connected to the drain of the first nMOS transistor. Further, there are a third pMOS transistor (4 of FIG. 1) having its source connected to the high magnitude side power source terminal and having its gate connected to the second control terminal (13 of FIG. 1), and a second nMOS transistor (5 of FIG. 1) having its source connected to the low magnitude side power source terminal and having its gate and drain connected to the drain of the third pMOS transistor. Additionally, there is a third nMOS transistor (6 of FIG. 1) having it source connected to the low magnitude side power source terminal and having its gate connected to the drain of the third pMOS transistor. The second pMOS transistor 3 has its drain connected to provide the high-side potential for the power source of a load circuit (9 of FIG. 1) and the third nMOS transistor 6 has its drain connected to provide the low-side potential for the power source of the same load circuit.

DETAILED DESCRIPTION OF THE PREFERRED EMBODIMENTS

Referring to the drawings, preferred embodiments of the present invention will be explained in detail.

FIG. 1 shows a circuit configuration of the first embodiment of the present invention. A constant voltage V1 is applied to a control terminal 12 to cause a substantially constant current in to flow in a saturated region in the nMOS transistor 1. This self-biases the gate voltage of a pMOS transistor 2, also biasing a pMOS transistor 3 to the same voltage.

Therefore, if the pMOS transistor 3 operates in the saturated region, a current in flows through the load.

Similarly, a constant voltage V2 is applied to a control terminal 13 to cause the substantially constant current ip to flow in a saturated region in the pMOS transistor 4. This self-biases the gate voltage of an nMOS transistor 5, also biasing an nMOS transistor 6 to the same voltage. Therefore, if the nMOS transistor 6 operates in the saturated range, a current ip flows through the load.

Although an inverter 9 is connected in FIG. 1 as a load for the pMOS transistor 3 and the nMOS transistor 6, it is also possible to use a circuit of generic MOS transistors.

In the inverter 9, the current in-flows from the voltage source VCC to the ground VSS, with the current flowing from ground VSS being ip. Therefore, if the pMOS transistor 7 and the nMOS transistor 8 making up the inverter 9 undergo fluctuations in current characteristics, a constant current flow is maintained by limitations imposed by the pMOS transistor 3 and the nMOS transistor 6.

The nMOS transistor 1 and the pMOS transistor 4 are formed on the same semiconductor substrate 10, while the pMOS transistor 2, pMOS transistor 3, nMOS transistor 5, nMOS transistor 6 and the inverter 9 are formed on a semiconductor substrate 11 other than the semiconductor substrate 10. On the other hand, a circuit similar to the nMOS transistor 1 and the pMOS transistor 4 can be separately formed on a semiconductor substrate 10, and a circuit similar to the pMOS transistor 2, pMOS transistor 3, nMOS transistor 5, nMOS transistor 6 and the inverter 9 can be formed on a semiconductor substrate other than the semiconductor substrate 10 or 11.

That is, if the semiconductor substrate 10 is used in common even if chips are different, a constant current can obviously be produced even on different chips, without regard to manufacture tolerances.

Figure 2:
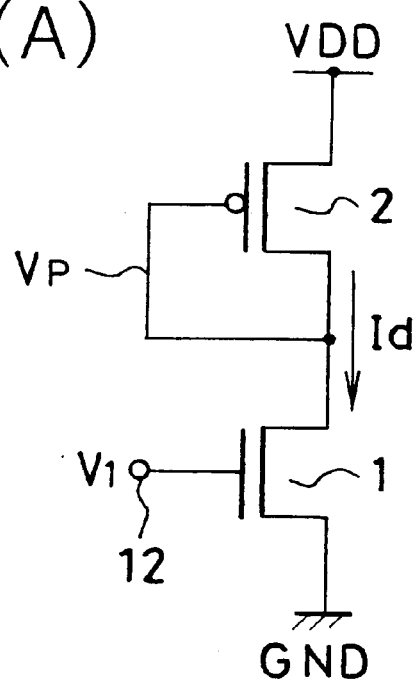
Figure 2:
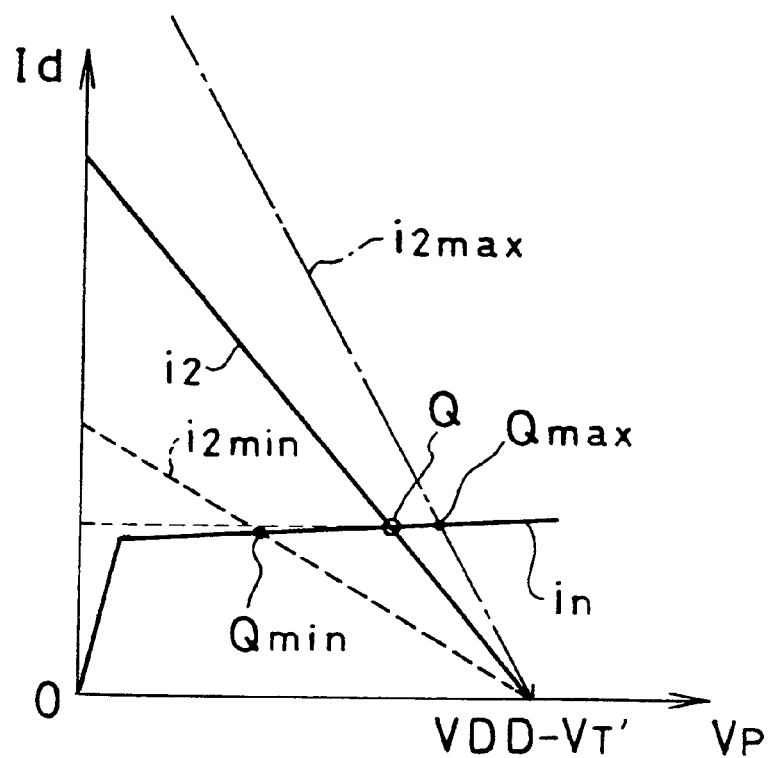

FIG. 2A illustrates the operation of a first embodiment of the present invention. FIG. 2A shows an equivalent circuit of the direct current flow path in which the nMOS transistor 1 of FIG. 1 is involved. This circuit is complementary equivalent of the direct current flow path relating to the pMOS transistor 4 of FIG. 1.

The nMOS transistor 1 and the pMOS transistor 2 are connected in series across the power source VDD and the ground GND. A constant control voltage V1 is applied from a control terminal 12 across the gate of the nMOS transistor. The gate of the pMOS transistor 2 is self-biased by a voltage Vp divided between the nMOS transistor 1 and the pMOS transistor 2.

FIG. 2B is a graph for illustrating the operation of the first embodiment of the present invention.

Specifically, FIG. 2B shows I–V characteristics of FIG. 2A, where the I–V curve "in" represents the drain-to-source voltage Vp at a gate voltage V1 of the nMOS transistor 1 versus drain current characteristics Id.

Curve i2 represents the drain-to-source voltage versus drain current characteristics when the drain-to-source current is applied as the gate voltage of the pMOS transistor 2. When the current through transistor 2, i2=0, Vp is VDD-VT', where VT' is the threshold voltage. A point of intersection Q between in and i2 represents the current Id flowing in the circuit of FIG. 2A. It is seen that, when the characteristics of i2 fluctuate because of manufacturing tolerances, denoted as i2max and i2min, the values of Id at respective points of intersection Qmax, Qmin with i2 remain substantially the same.

That is, if the nMOS transistor 1 operates in the saturated region, a constant current may be obtained irrespective of the manufacture tolerances.

Figure 3:
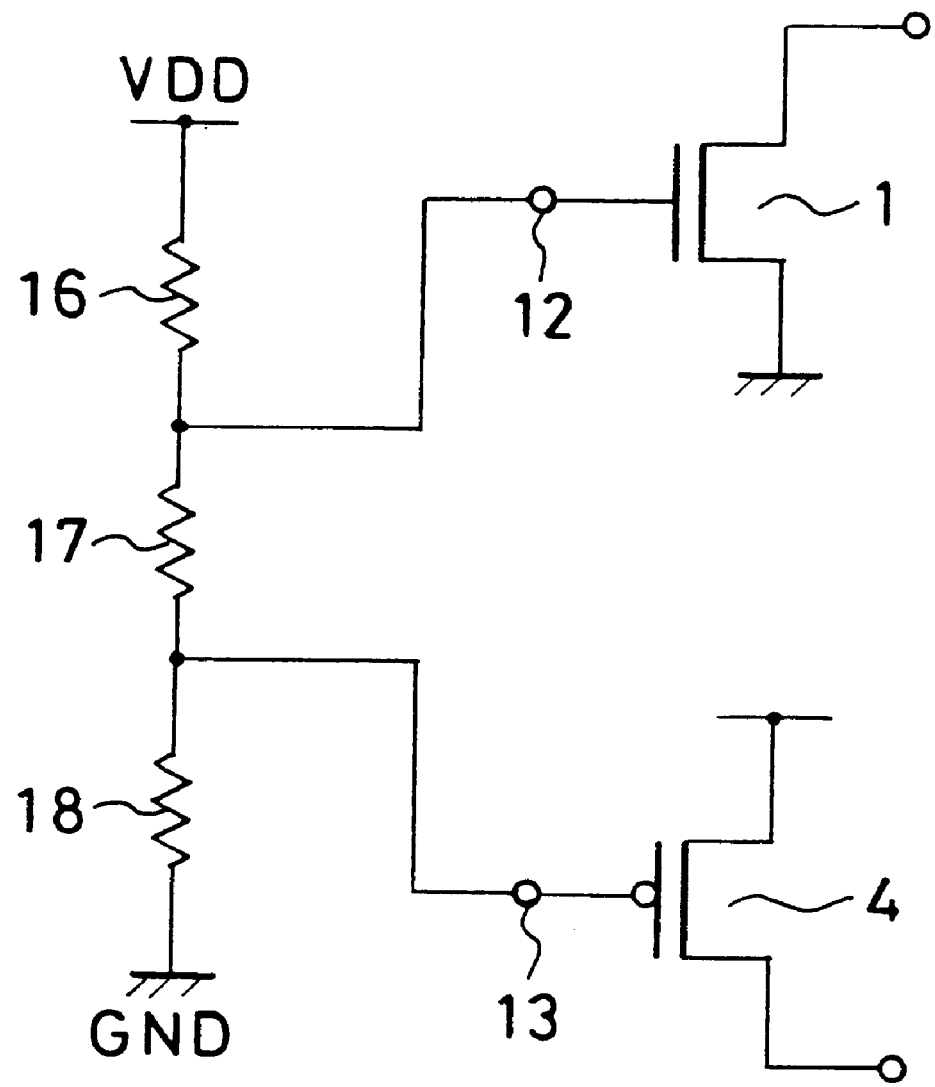
FIG. 3 shows a circuit structure of a second embodiment of the present invention.

FIG. 3 shows a second embodiment of the present invention. For obtaining the constant control voltages V1 and V2 applied across control terminals 12 and 13 of FIG. 1, voltages are obtained by voltage division across resistors 16, 17 and 18 which are tied in series across VDD and GND.

Although the absolute values of the resistance fluctuate significantly, the resistance ratio can be made extremely accurate in the manufacture process. This generates the control voltages V1 and V2 irrespective of manufacture tolerances.

Figure 4:
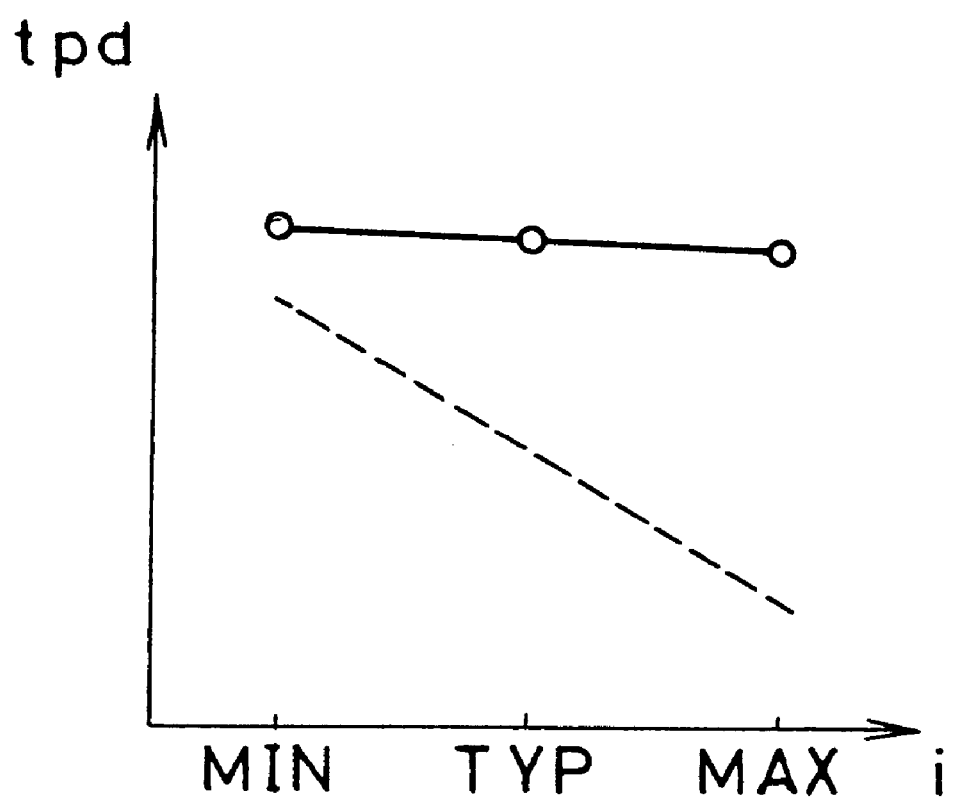
FIG. 4 is a graph showing changes in propagation delay time with respect to current fluctuations for the purpose of illustrating the operation and result of the embodiment of the present invention.
Figure 5:
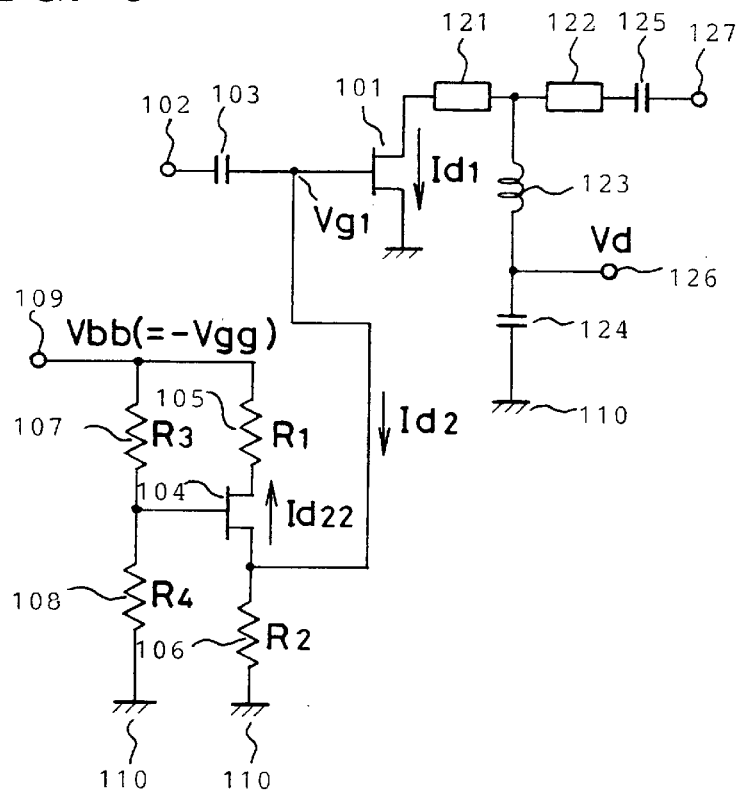
FIG. 5 shows a typical structure of a conventional gate bias circuit.

FIG. 4 is a graph for illustrating the operation and effect of the embodiment of the present invention. The abscissa of FIG. 4 denotes the value of the current of the transistor, in which TYP, MAX and MIN denote the mean value, maximum value and minimum value of the transistor currents caused by manufacture tolerances. The ordinate of FIG. 4 denotes the propagation delay time (tpd) of the load circuit (inverter 9). It is seen that, with the circuit of the first embodiment of the present invention, there is no adverse effect due to fluctuations, as indicated by the solid line, while significant fluctuations occur with the conventional circuit indicated by the broken line.

The meritorious effects of the present invention are summarized as follows.

It is seen from above that, according to the present invention, a constant current can perpetually be supplied without regard to manufacture tolerances, so that the propagation delay time can be rendered constant.

The reason therefor may be explained as follows: In general, the load of the MOS transistor is often capacitative, such that the time required for charging/discharging the capacitance represents the propagation delay time. The charge charged to or discharged from the capacitance is the product of the current and the charging/discharging time, such that, if the charge and the current remain constant, the charging/discharging time, that is the propagation delay time, also becomes constant. The reason is that, according to the present invention, a constant current can perpetually be supplied by utilizing the saturated region of the MOS transistors despite fluctuations in the characteristics of the MOS transistor operating as a load.

It should be noted that modification obvious to one skilled in the art may be made without departing from the gist and scope of the present invention as disclosed and claimed hereinbelow.

What is claimed is:

1. A semiconductor integrated circuit comprising:
   an nMOS transistor having its source and gate connected to a low magnitude side power source terminal and to a first control terminal, respectively;
   a first current mirror circuit, mirror-reflecting the current flowing in said nMOS transistor;
   a pMOS transistor having its source and gate connected to a high magnitude side power source terminal and to a second control terminal, respectively; and
   a second current mirror circuit, mirror-reflecting the current flowing in said pMOS transistor;
   wherein high and low potentials are provided to serve as a power source to a load circuit by connection of said load circuit across an output terminal of said first current mirror circuit and an output terminal of said second current mirror circuit, respectively;
   wherein during a normal operation of the semiconductor integrated circuit, said pMOS transistor and said nMOS transistor each operate in a saturated ranges wherein said nMOS transistor and said pMOS transistor are integrated on a first semiconductor substrate; and
   wherein the first and second current mirror circuits are integrated together on a semiconductor substrate other than said first semiconductor substrate.

2. The semiconductor integrated circuit as defined in claim 1 wherein first, second, and third resistors are connected in series across said high magnitude side power source terminal and said low magnitude side power source terminal,
   a node of said first and second resistors is connected to the first control terminal, and a node of the second and third resistors is connected to said second control terminal.

3. A semiconductor integrated circuit comprising:
   a first nMOS transistor having its source and gate connected to a low magnitude side power source terminal and to a first control terminal, respectively;
   a first pMOS transistor having its source connected to a high magnitude side power source terminal and having its gate and drain connected to a drain of the first nMOS transistor;
   a second pMOS transistor having its source connected to said high magnitude side power source terminal and having its gate connected to the drain of said first nMOS transistor;
   a third pMOS transistor having its source connected to said high magnitude side power source terminal and having its gate connected to a second control terminal;
   a second nMOS transistor having its source connected to said low magnitude side power source terminal and having its gate and drain connected to the drain of said third pMOS transistor;
   a third nMOS transistor having its source connected to said low magnitude side power source terminal and having its gate connected to the drain of said third pMOS transistor;
   wherein the second pMOS transistor has its drain connected to serve as a high potential terminal of a power source for a load circuit, and the third nMOS transistor has its drain connected to serve as a low potential terminal of said power source for the load circuit;
   wherein during a normal operation of the semiconductor integrated circuit, said third pMOS transistor and said first nMOS transistor each operate in a saturated range;
   wherein said first nMOS transistor and said third pMOS transistor are integrated on a first semiconductor substrate, and
   wherein the first pMOS transistor, the second pMOS transistor, the second nMOS transistor and the third nMOS transistor are integrated together on a semiconductor substrate other than said first semiconductor substrate.

4. The semiconductor integrated circuit as defined in claim 3 wherein first, second, and third resistors are connected in series across said high magnitude side power source terminal and said low magnitude side power source terminal,
   a node of said first and second resistors is connected to the first control terminal, and a node of the second and third resistors is connected to said second control terminal.

* * * * *